United States Patent
Hu

(10) Patent No.: US 10,872,840 B2
(45) Date of Patent: Dec. 22, 2020

(54) THERMAL CONDUCTIVE SHEET

(71) Applicant: Wuhan China Star Optoelectronics Semiconductor Display Technology Co., Ltd., Hubei (CN)

(72) Inventor: Niu Hu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 323 days.

(21) Appl. No.: 16/008,866

(22) Filed: Jun. 14, 2018

(65) Prior Publication Data
US 2019/0229034 A1 Jul. 25, 2019

Related U.S. Application Data

(63) Continuation of application No. PCT/CN2018/078915, filed on Mar. 14, 2018.

(30) Foreign Application Priority Data

Jan. 19, 2018 (CN) .......................... 2018 1 0053143

(51) Int. Cl.
*H01L 23/373* (2006.01)
*C08J 5/18* (2006.01)
(Continued)

(52) U.S. Cl.
CPC .............. *H01L 23/373* (2013.01); *B32B 7/04* (2013.01); *C01B 32/205* (2017.08); *C08J 5/121* (2013.01);
(Continued)

(58) Field of Classification Search
CPC .. C08J 5/18; C08J 5/121; B32B 15/08; B32B 15/09; B32B 15/20; B32B 2250/02; B32B 2307/208; B32B 2307/302; B32B 27/281; B32B 27/36; B32B 3/08; B32B 3/04; B32B 3/12; C01B 32/205; H01L 23/373; H01L 23/3737; H01L 23/42; H05K 7/20
See application file for complete search history.

(56) References Cited

U.S. PATENT DOCUMENTS

2003/0190896 A1* 10/2003 Ota .................... H01Q 21/28
455/90.3
2007/0001292 A1* 1/2007 Ohta .................... H01L 24/29
257/718
(Continued)

FOREIGN PATENT DOCUMENTS

| CN | 201607151 | 10/2010 |
| CN | 206040630 | 3/2017 |
| CN | 107554017 | 1/2018 |

*Primary Examiner* — Vongsavanh Sengdara
(74) *Attorney, Agent, or Firm* — Leong C. Lei

(57) ABSTRACT

The present invention provides with a thermal conductive sheet including a foldable layer having a bending region, a graphite sheet disposed on the foldable layer, and disposed outside the bending region, a first adhesive layer covered on the graphite sheet and the foldable layer, and a polymer film layer coated on the first adhesive layer. Accordingly, the present invention has a good heat dissipation effect, bendable and flexible in order to avoid a layer separation phenomenon.

17 Claims, 2 Drawing Sheets

(51) Int. Cl.
*C01B 32/205* (2017.01)
*B32B 7/04* (2019.01)
*C08J 5/12* (2006.01)
*H05K 7/20* (2006.01)
*H01L 23/42* (2006.01)

(52) U.S. Cl.
CPC .................. *C08J 5/18* (2013.01); *H05K 7/20* (2013.01); *B32B 2307/302* (2013.01); *H01L 23/3737* (2013.01); *H01L 23/42* (2013.01)

(56) References Cited

U.S. PATENT DOCUMENTS

| | | | |
|---|---|---|---|
| 2010/0132871 A1* | 6/2010 | Hattori | B32B 9/007 156/60 |
| 2014/0003006 A1* | 1/2014 | Ahn | G06F 1/1652 361/749 |
| 2015/0118482 A1* | 4/2015 | Kagawa | B32B 27/308 428/323 |
| 2016/0205792 A1* | 7/2016 | Ahn | H05K 5/0217 40/779 |
| 2016/0212890 A1* | 7/2016 | Jeong | G06F 1/20 |
| 2017/0142847 A1* | 5/2017 | Park | G09F 9/301 |
| 2018/0037001 A1* | 2/2018 | Nagashima | H01L 23/3735 |

* cited by examiner

THERMAL CONDUCTIVE SHEET

CROSS REFERENCE

This application is a continuing application of PCT Patent Application No. PCT/CN2018/078915, entitled "THERMAL CONDUCTIVE SHEET", filed on Mar. 14, 2018, which claims priority to China Patent Application No. CN201810053143.7 filed on Jan. 19, 2018, both of which are hereby incorporated in its entireties by reference.

FIELD OF THE INVENTION

The present invention relates to a flexible display technology field, and more particularly to a thermal conductive sheet.

BACKGROUND OF THE INVENTION

Along with the development of the mobile phone industry, the application of the mobile phone is not limited to a flat display such that a flexible and curved display mobile phone has rapidly developed such as a 3D curved mobile phone. Therefore, the research for a foldable display product is more and more. The foldable display product has higher and higher demand for integrity of the product. As well-known by people, when a resolution of a mobile phone is higher, the integrated degree inside the mobile phone is higher such that the demand for the heat dissipation of the mobile phone is increased.

Currently, the materials that mainly applied in the heat dissipation can be graphite and copper. The graphite material has wide and special performances such as high transparency, high conductivity, high thermal conductivity, high strength so that the graphite material can develop various application types such as graphite circuit structure, graphite chip structure, graphite touch screen structure, etc. Wherein a graphite sheet is a brand new thermal conductive material. Because the graphite sheet has an excellent two-dimensional thermal conductive performance so that the application is wider. However, an adhesive force between layers of the graphite sheet is smaller, and a layer separation phenomenon is easily to generate under a small force so that the graphite sheet exists a large challenge in a foldable product.

Accordingly, a heat dissipation sheet based on graphite sheet is required to apply in the foldable product, and has a good heat dissipation effect, bendable and flexible and capable of avoiding a layer-separation phenomenon.

SUMMARY OF THE INVENTION

The technology problem solved by the embodiment of the present invention is, providing a heat dissipation sheet having a good heat dissipation effect, bendable and flexible and capable of avoiding a layer-separation phenomenon In order to solve the above technology problem, the embodiment of the present invention provides a thermal conductive sheet comprising: a foldable layer having a bending region; a graphite sheet disposed on the foldable layer, and disposed outside the bending region; a first adhesive layer covered on the graphite sheet and the foldable layer; and a polymer film layer coated on the first adhesive layer.

Wherein the graphite sheet is disposed at two sides of the bending region of the foldable layer.

Wherein the graphite sheet is provided with a heat dissipation hole.

Wherein the first adhesive layer is also filled in the heat dissipation hole and through the dissipation hole, the foldable layer and the graphite sheet are adhered together.

Wherein between the foldable layer and the graphite sheet, a second adhesive layer is provided to adhere the foldable layer and the graphite sheet together.

Wherein a material of the foldable layer is a copper foil.

Wherein a material of the polymer film layer is PI or PET.

Correspondingly, the embodiment of the present invention also provides a thermal conductive sheet comprising: a foldable layer having a bending region; a graphite sheet disposed on the foldable layer, and disposed outside the bending region; a first adhesive layer covered on the graphite sheet and the foldable layer; and a polymer film layer coated on the first adhesive layer; wherein the graphite sheet is provided with a heat dissipation hole.

Wherein the first adhesive layer is also filled in the heat dissipation hole and through the dissipation hole, the foldable layer and the graphite sheet are adhered together.

Wherein between the foldable layer and the graphite sheet, a second adhesive layer is provided to adhere the foldable layer and the graphite sheet together.

Wherein a material of the foldable layer is a copper foil.

Wherein a material of the polymer film layer is PI or PET.

Correspondingly, the embodiment of the present invention also provides a thermal conductive sheet comprising: a foldable layer having a bending region; a graphite sheet disposed on the foldable layer, and disposed outside the bending region; a first adhesive layer covered on the graphite sheet and the foldable layer; and a polymer film layer coated on the first adhesive layer; wherein between the foldable layer and the graphite sheet, a second adhesive layer is provided to adhere the foldable layer and the graphite sheet together.

Wherein a material of the foldable layer is a copper foil.

Wherein the graphite sheet is provided with a heat dissipation hole.

Wherein the graphite sheet is disposed at two sides of the bending region of the foldable layer.

Wherein a material of the polymer film layer is PI or PET.

The embodiment of the present invention has following beneficial effect: comparing to the conventional graphite sheet, the present invention disposes the graphite sheet having a good heat dissipation effect outside the bending region of the foldable layer. Through avoid bending the graphite sheet to prevent the graphite sheet from cracking and layer separation so as to have a good heat dissipation effect in order to avoid the layer separation. At the same time, a polymer film layer having a better flexibility can be coated on the bending region of the foldable layer, which can improve the bending resistance and the flexibility.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail.

Figure 1:
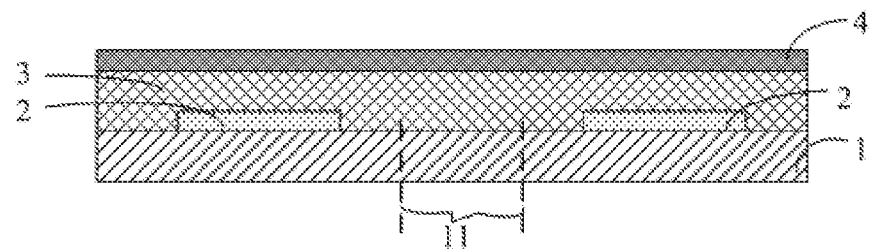
FIG. 1 is a schematic diagram of a cross-sectional view of a thermal conductive sheet according to an embodiment of the present invention.

As shown in FIG. 1, an embodiment of the present invention provides a thermal conductive sheet, comprising:

a foldable layer 1 having a bending region 11;

a graphite sheet 2 disposed on the foldable layer 1, and disposed outside the bending region 11;

a first adhesive layer 3 covers on the graphite sheet 2 and the foldable layer 1;

a polymer film layer 4 coated on the first adhesive layer 3.

It can be understood that the graphite sheet 2 is located outside the bending region 11 of the foldable layer 1 so that the graphite sheet 2 not only has a good heat dissipation effect, but also can avoid the graphite sheet 2 from bending, layer separation and cracking when bending. At the same time, because the first adhesive layer 3 can fill the bending region 11 of the foldable layer 1, the bending resistance and the flexibility can be effectively improved.

It should be noted that the bending region 11 of the foldable layer 1 can be formed integrally, or disposed separately such that the bending resistance and the flexibility of the foldable layer 1 are better.

In the present embodiment, the foldable layer 1 can be made by metal such as an aluminum foil, a copper foil, or a thin foil which has a very thin thickness. Accordingly, the foldable layer 1 not only has a good heat dissipation property, but also has an anti-magnetic interference effect.

In the present embodiment, the graphite sheet 2 can be disposed at two sides of the bending region 11 of the foldable layer 1. By this way, the thermal conductive sheet of the present invention can dissipate heat at two sides in order to increase the heat dissipation effect of the thermal conductive sheet. Of course, the graphite sheet 2 can adopt a single-layered structure or a stacked-layered structure having a better heat dissipation effect. In the stacked-layered structure, adjacent layers of the graphite sheet 2 can be isolated through a release film. It should be noted that if the foldable layer 1 has multiple bending regions 11, at each region outside the multiple bending regions 11, the graphite sheet 2 can be provided in order to increase the heat dissipation effect. For decreasing the risk of the bending, the layer separation and the cracking, at each region outside the multiple bending regions 11, the number of the graphite sheet 2 is increased to reduce a length of a single graphite sheet 2 so that the graphite sheet 2 can have a better stress resistance.

Figure 2:
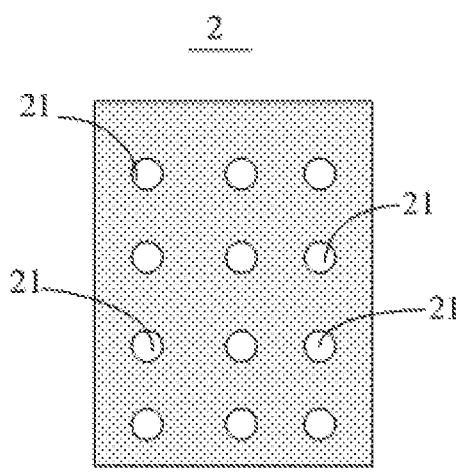
FIG. 2 is a schematic diagram of a graphite sheet.

In the embodiment of the present invention, as shown in FIG. 2, in order to increase the heat dissipation effect of the graphite sheet 2, a heat dissipation hole 21 is provided on the graphite sheet 2. Of course, in order to increase the robustness of the graphite sheet 2, and avoid the graphite sheet 2 from sliding, especially when bending, the first adhesive layer 3 is also filled in the heat dissipation hole 21 and through the dissipation hole 21, the foldable layer 1 and the graphite sheet 2 are adhered together.

In the embodiment of the present invention, the first adhesive layer 3 adopts adhesive glue such as a UV glue or a thermosetting glue having a good thermal conductive property.

Figure 3:
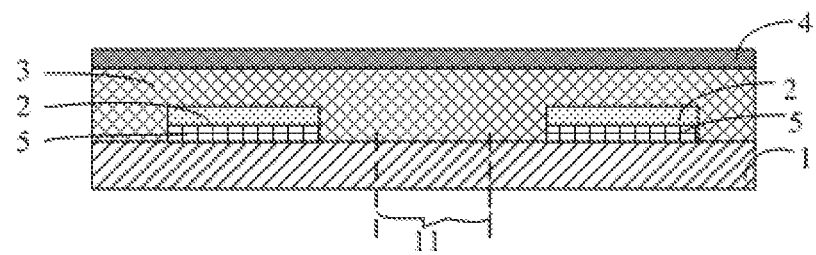
FIG. 3 is a schematic diagram of a cross-sectional view of a thermal conductive sheet according to an embodiment of the present invention.

In the embodiment of the present invention, as shown in FIG. 3, between the foldable layer 1 and the graphite sheet 2, a second adhesive layer 5 is provided to adhere the foldable layer 1 and the graphite sheet 2 together. Accordingly, the firmness of the graphite sheet 2 can be increased. It can be understood that the second adhesive layer 5 can adopt a material same as the first adhesive layer 3.

In the embodiment, a material of the polymer film layer 4 can be PI or PET. Accordingly, the flexible property of the thermal conductive sheet is better.

Figure 4:
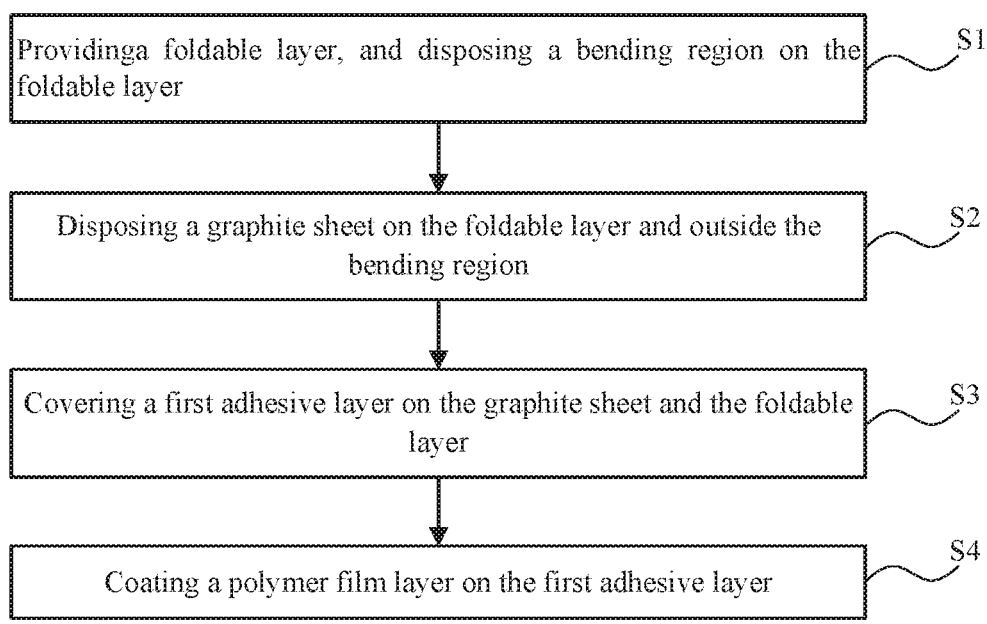
FIG. 4 is a flow chart of a manufacturing method for a thermal conductive sheet according to an embodiment of the present invention.

A shown in FIG. 4, a manufacturing method for a thermal conductive sheet is provided, and the method includes steps of:

Step S1: providing a foldable layer, and disposing a bending region on the foldable layer;

Step S2: disposing a graphite sheet on the foldable layer and outside the bending region;

Step S3: covering a first adhesive layer on the graphite sheet and the foldable layer;

Step S4: coating a polymer film layer on the first adhesive layer.

In the embodiment of the present invention, the first adhesive layer in the step S3 requires to perform a corresponding treatment in order to adhere the graphite sheet to the foldable layer such as perform a UV curing to the UV glue or performing a thermal curing to the thermosetting glue.

Of course, in order to increase the firmness of the graphite sheet, in the step S2 and the step S3, the method further includes a step of disposing a second adhesive layer between the foldable layer and the graphite sheet, and second adhesive layer adheres the foldable layer and the graphite sheet together.

Wherein the graphite sheet is disposed at two sides of the bending region of the foldable layer.

Wherein the graphite sheet is provided with a heat dissipation hole.

In summary, the embodiment of the present invention has following beneficial effect: comparing to the conventional graphite sheet, the present invention disposes the graphite sheet having a good heat dissipation effect outside the bending region of the foldable layer. Through avoid bending the graphite sheet to prevent the graphite sheet from cracking and layer separation so as to have a good heat dissipation effect in order to avoid the layer separation. At the same time, a polymer film layer having a better flexibility can be coated on the bending region of the foldable layer, which can improve the bending resistance and the flexibility.

The above is only the specific implementation mode of the present disclosure and not intended to limit the scope of protection of the present disclosure, and any variations or replacements apparent to those skilled in the art within the technical scope of the present disclosure shall fall within the scope of protection of the present disclosure. Therefore, the scope of protection of the present disclosure should be the scope of protection of the claims.

What is claimed is:

1. A thermal conductive sheet comprising:
a foldable layer having a bending region;
a graphite sheet disposed on the foldable layer, and disposed outside the bending region;
a first adhesive layer covered on the graphite sheet and the foldable layer; and a polymer film layer coated on the first adhesive layer;
wherein the graphite sheet disposed outside the bending region of the foldable layer comprises an opening through which a surface of the bending region of the foldable layer is exposed, and wherein the first adhesive layer is partly filled in the opening of the graphite sheet to directly and adhesively contact the surface of the bending region of the foldable layer and the polymer film layer is fixed to the surface of the bending region of the foldable layer.

2. The thermal conductive sheet according to claim 1, wherein the graphite sheet is disposed at two sides of the bending region of the foldable layer.

3. The thermal conductive sheet according to claim 2, wherein the graphite sheet is provided with a heat dissipation hole.

4. The thermal conductive sheet according to claim 3, wherein the first adhesive layer is also filled in the heat dissipation hole and through the dissipation hole, the foldable layer and the graphite sheet are adhered together.

5. The thermal conductive sheet according to claim 4, wherein between the foldable layer and the graphite sheet, a second adhesive layer is provided to adhere the foldable layer and the graphite sheet together.

6. The thermal conductive sheet according to claim 5, wherein a material of the foldable layer is a copper foil.

7. The thermal conductive sheet according to claim 6, wherein a material of the polymer film layer is polyimide (PI) or polyethylene terephthalate (PET).

8. A thermal conductive sheet comprising:
a foldable layer having a bending region;
a graphite sheet disposed on the foldable layer, and disposed outside the bending region;
a first adhesive layer covered on the graphite sheet and the foldable layer; and
a polymer film layer coated on the first adhesive layer;
wherein the graphite sheet is provided with a heat dissipation hole; and
wherein the graphite sheet disposed outside the bending region of the foldable layer comprises an opening through which a surface of the bending region of the foldable layer is exposed, and wherein the first adhesive layer is partly filled in the opening of the graphite sheet to directly and adhesively contact the surface of the bending region of the foldable layer and the polymer film layer is fixed to the surface of the bending region of the foldable layer.

9. The thermal conductive sheet according to claim 8, wherein the first adhesive layer is also filled in the heat dissipation hole and through the dissipation hole, the foldable layer and the graphite sheet are adhered together.

10. The thermal conductive sheet according to claim 9, wherein between the foldable layer and the graphite sheet, a second adhesive layer is provided to adhere the foldable layer and the graphite sheet together.

11. The thermal conductive sheet according to claim 10, wherein a material of the foldable layer is a copper foil.

12. The thermal conductive sheet according to claim 11, wherein a material of the polymer film layer is polyimide (PI) or polyethylene terephthalate (PET).

13. A thermal conductive sheet comprising:
a foldable layer having a bending region;
a graphite sheet disposed on the foldable layer, and disposed outside the bending region;
a first adhesive layer covered on the graphite sheet and the foldable layer; and
a polymer film layer coated on the first adhesive layer;
wherein between the foldable layer and the graphite sheet, a second adhesive layer is provided to adhere the foldable layer and the graphite sheet together; and
wherein the graphite sheet disposed outside the bending region of the foldable layer comprises an opening through which a surface of the bending region of the foldable layer is exposed, and wherein the first adhesive layer is partly filled in the opening of the graphite sheet to directly and adhesively contact the surface of the bending region of the foldable layer and the polymer film layer is fixed to the surface of the bending region of the foldable layer.

14. The thermal conductive sheet according to claim 13, wherein a material of the foldable layer is a copper foil.

15. The thermal conductive sheet according to claim 14, wherein the graphite sheet is provided with a heat dissipation hole.

16. The thermal conductive sheet according to claim 15, wherein the graphite sheet is disposed at two sides of the bending region of the foldable layer.

17. The thermal conductive sheet according to claim 16, wherein a material of the polymer film layer is polyimide (PI) or polyethylene terephthalate (PET).

\* \* \* \* \*